(12) United States Patent
Adamec

(10) Patent No.: US 7,932,495 B2
(45) Date of Patent: Apr. 26, 2011

(54) FAST WAFER INSPECTION SYSTEM

(75) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 193 days.

(21) Appl. No.: 12/202,833

(22) Filed: Sep. 2, 2008

(65) Prior Publication Data

US 2010/0051804 A1 Mar. 4, 2010

(51) Int. Cl.
*G21K 7/00* (2006.01)
*H01J 37/08* (2006.01)

(52) U.S. Cl. .................. 250/307; 250/310

(58) Field of Classification Search ............ 250/307, 250/310

See application file for complete search history.

(56) References Cited

U.S. PATENT DOCUMENTS

| | | | |
|---|---|---|---|
| 6,614,022 B2 * | 9/2003 | Hiroi et al. | 850/10 |
| 6,717,144 B2 * | 4/2004 | Kimura et al. | 850/9 |
| 6,885,000 B1 | 4/2005 | Adler | |
| 6,940,069 B2 * | 9/2005 | Hiroi et al. | 850/10 |
| 6,943,349 B2 * | 9/2005 | Adamec et al. | 850/9 |
| 7,075,076 B2 * | 7/2006 | Makino et al. | 250/310 |
| 2002/0030166 A1 * | 3/2002 | Hiroi et al. | 250/492.3 |
| 2004/0028272 A1 * | 2/2004 | Hiroi et al. | 382/162 |
| 2005/0263703 A1 * | 12/2005 | Hiroi et al. | 250/310 |
| 2006/0060780 A1 | 3/2006 | Masnaghetti et al. | |
| 2009/0014649 A1 | 1/2009 | Nakasuji et al. | |
| 2010/0051804 A1 * | 3/2010 | Adamec | 250/307 |

FOREIGN PATENT DOCUMENTS

WO WO-2006/101116 9/2006

OTHER PUBLICATIONS

European Search Report for Application No. 08163524.5-2208 dated Apr. 7, 2009.

* cited by examiner

*Primary Examiner* — David A Vanore
(74) *Attorney, Agent, or Firm* — Patterson & Sheridan, L.L.P.

(57) ABSTRACT

A charged particle beam device is provided including a particle source emitting a primary particle beam, a secondary particle beam generated by the impingement of the primary particle beam on the sample, a detection unit for detecting the secondary particle beam, the detector having at least two detector channels, and a distribution deflecting device for deflecting the secondary particle beam in a chronological sequence. Further, a detection assembly for a fast wafer inspection system is provided including a distribution deflecting device for distributing a secondary particle beam in a chronological sequence and a detector for detecting the secondary particle beam, the detector having multiple detector channels. Further, a method of operating a particle beam device with chronological resolution is provided.

22 Claims, 10 Drawing Sheets

US 7,932,495 B2

FAST WAFER INSPECTION SYSTEM

FIELD OF THE INVENTION

The invention relates to a charged particle beam device and a method of operating a charged particle beam device. Particularly, it relates to a charged particle beam device having a particle source, in particular for imaging and/or inspecting a sample and a detector for detecting secondary particles. Further, it relates to a method of operating a particle beam device for high-speed inspection of a sample. Further, it relates to a detector assembly for a fast inspection system.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators.

For inspecting a sample with a charged particle beam device, the particle beam is directed on a sample. By the impingement of the primary particle beam on the sample, a secondary beam of signal particles is generated. For example, charged signal particles are secondary charged particles which are backscattered from, transmitted through, and/or scattered by the specimen. Moreover, secondary charged particles, which are generated upon interaction of the primary charged particles with the specimen, are also referred to as charged signal particles.

The throughput of the samples is an important factor with regard to the efficiency of a charged particle beam device. As the inspection may be part of the production process, a fast inspection process is desirable. Apart from sample change, beam calibration and beam scanning, one of the limiting factors is the response time of the detector.

Furthermore, particle beam devices are known, which provide a more precise signal generation by improving the separation of the primary and the secondary particle beam or by separating different secondary particle beams in case a plurality of primary particle beams are used in order to speed up the inspection process.

SUMMARY

In light of the above, a charged particle beam device according to independent claim 1, a detection assembly for fast wafer inspection according to independent claim 7 and a method of operating a charged particle beam according to independent claim 9 are provided.

According to one embodiment, a charged particle beam device is provided including a particle source for emitting a primary particle beam, and thereby generating a secondary particle beam generated on impingement of the primary particle beam on a sample, a detection unit for detecting the secondary particle beam, the detector having at least two detector channels, and a distribution deflecting device for deflecting the secondary particle beam in a chronological sequence.

Further advantages, features, aspects and details that can be combined with embodiments described herein are evident from the dependent claims, the description and the drawings.

According to another embodiment, a detection assembly for fast wafer inspection for inspecting a sample with a primary charged particle beam, for generating a secondary particle beam by impinging on the sample, is provided, the detector assembly including a distribution deflecting device for distributing a secondary particle beam in a chronological sequence and a detector for detecting the secondary particle beam, the detector having multiple detector channels.

According to yet another embodiment, a method of operating a particle beam device with chronological resolution is provided, the method including directing the particle beam onto a sample thereby generating a secondary particle beam coming from the sample, directing the secondary particle beam towards a detector unit with at least two detection channels, and distributing the secondary particle beam in a chronological sequence to the at least two detector channels.

Embodiments are also directed to apparatuses for carrying out the disclosed methods and including apparatus parts for performing each described method step. These method steps may be performed by way of hardware components, a computer programmed with appropriate software, by any combination of the two or in any other manner. Furthermore, embodiments are also directed to methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE INVENTION

Figure 1:
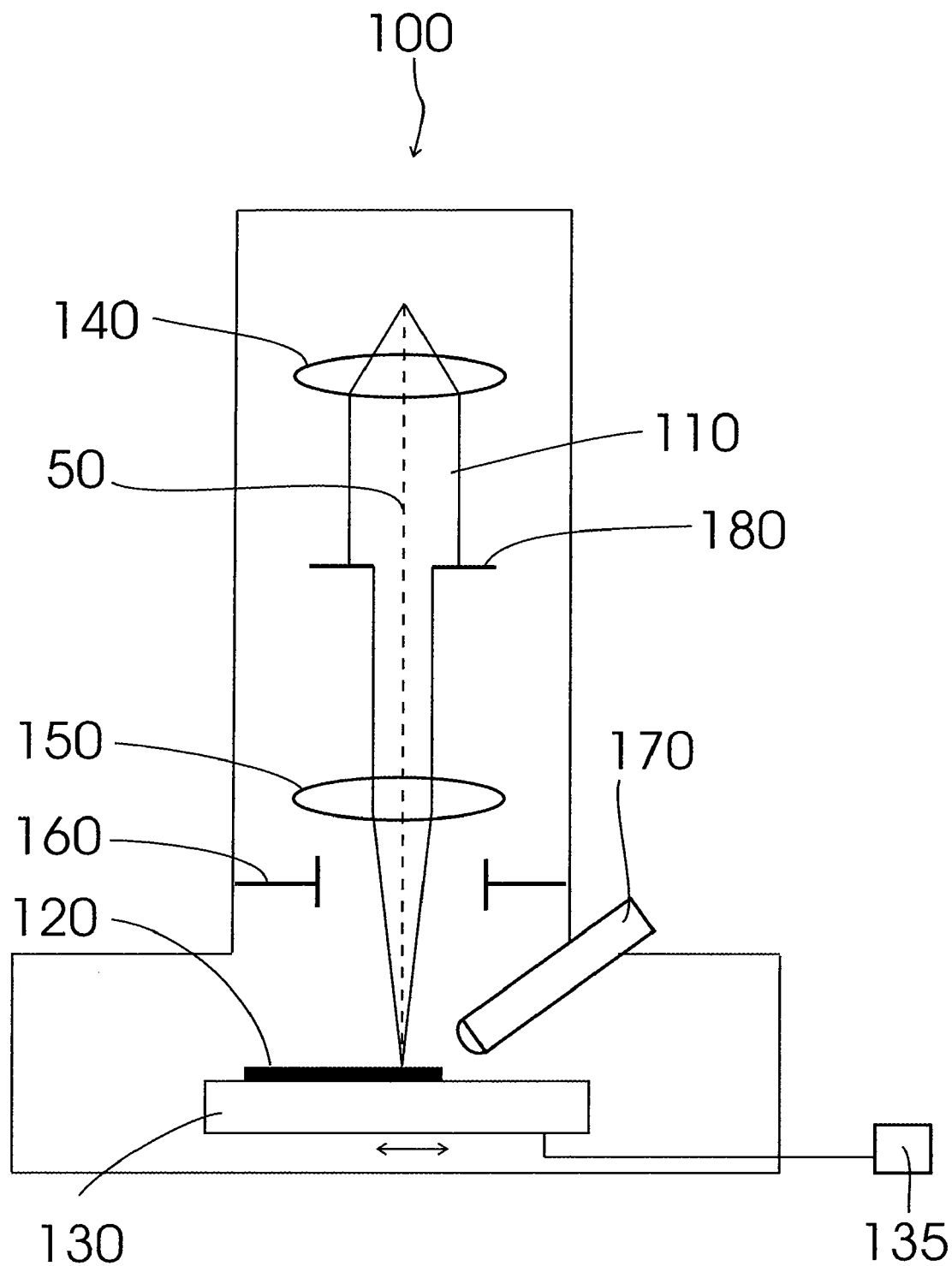
FIG. 1 shows a schematic view of a charged particle beam device known in the art.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following description the charged particle beam device or components thereof will exemplarily be referred to as an electron beam device including the detection of secondary electrons. The present invention can still be applied for other charged particle apparatuses and/or for components detecting corpuscles such as secondary and/or backscattered charged particles in the form of electrons or ions, photons, X-rays or other signals in order to obtain a specimen image.

Within the following description of the drawings, the same reference numbers refer to the same components. Generally, only the differences with respect to the individual embodiments are described.

A "specimen" or "sample" as referred to herein, includes, but is not limited to, semiconductor wafers, semiconductor workpieces, and other workpieces such as memory disks and the like. Embodiments of the invention may be applied to any workpiece on which material is deposited which has to be examined or inspected or which has to be structured.

As mentioned above, the time consuming process of the inspection of a specimen influences the efficiency of a charged particle beam device. Therefore, a charged particle beam device and a detector assembly are provided to improve the time exposure for the inspection.

Detectors known in the art are capable of measuring and detecting the signals of the specimen in a spatial manner. The primary beam impinges on the specimen, thereby initiating the release of secondary particles or backscattering of particles in the direction opposing the direction of the primary beam. The secondary particles move to a detector. The detector receives the charged particles and generates a signal, e.g. a light signal in form of a photon, which is passed to a photo sensor element. The primary particle beam scans the sample and moves forward to scan the next portion (pixel) of the sample. The speed of scanning or speed of the addressing of the next sample position can be limited by the signal-to-noise ration or the resolution of the system. Alternatively, a plurality of charged particle beams moves over the specimen to help to speed-up the scanning process. In case of several primary beams, several detectors are provided in order to detect the respective secondary charged particle beams each being caused by another primary beam.

The charged particle beam device according to embodiments described herein, allows a faster inspection of the sample due to a scanning and detector technique with chronological sequence. The detector operates, for instance, it changes an incoming beam signal to a light signal, which is then transformed in an electrical signal. This electrical signal is the output of a detector. The speed of the primary particle beam can be increased without depending on the detector operation and the detector signal.

According to embodiments described herein, a charged particle beam device is provided allowing a continuous measurement of the sample, resulting in a time dependent resolution. A detector is provided having several detector channels, which are separated from each other so that they can act independently of one another. The primary particle beam can move over the specimen and scan the specimen with less or no limitation from the detector unit. Thereby, the secondary particle beam can be measured with an increased measurement speed, whereby all of the secondary particle beams originate from one primary particle beam.

The structural segmentation of the detector according to some embodiments described herein, i.e. the structural separation in several detector channels serves for and induces, by using the charged particle beam device, a time-dependent resolution of the scanning process and allows a quasi continuous measurement of the sample. Therefore, an n-fold separation allows an n-fold acceleration of the scanning process.

The chronological sequence and resulting thereof the time resolution of the charged particle detector can be achieved, for instance, by segmenting the detector or by a detector having a plurality of detection channels, whereby the secondary particles generated in a short time, are directed to different segments or channels of the detector. Thereby, the present invention overcomes the above described limitation by employing a multi-channel detection in a single beam inspection system. The multi-channel inspection system allows increasing the detection speed by a factor equal to the number of detection channels.

FIG. 1 shows a particle beam device 100 known in the prior art. A primary particle beam 110 is generated, which may be an electron beam, an ion beam, a light beam (laser) or another particle beam. In the following, embodiments are exemplarily described referring to a charged particle beam. The primary particle beam 110 generally follows the optical axis 50 of the charged particle beam device. The primary charged particle beam 110 passes through a condenser lens 140 and an aperture 180. A deflector unit 160 directs the primary charged particle beam 110 to the specimen 120. The beam is focused on the specimen 120 located on the specimen support 130 by objective lens 150. Secondary and/or backscattered particles released from the specimen by the impingement of the charged particles trespass the detector 170. According to some embodiments, the detector 170 can include a scintillation element.

Generally, it is possible according to some embodiments that the primary charged particle beam 110 is decelerated by an appropriate potential of the specimen and the secondary and/or backscattered charged particles are accelerated away from the specimen 120 towards the detection unit.

A stage controller 135 may be provided to move the sample stage 130 in order to change the sample or help scanning another area of the sample without moving the column of the charged particle beam device.

Figure 2A:
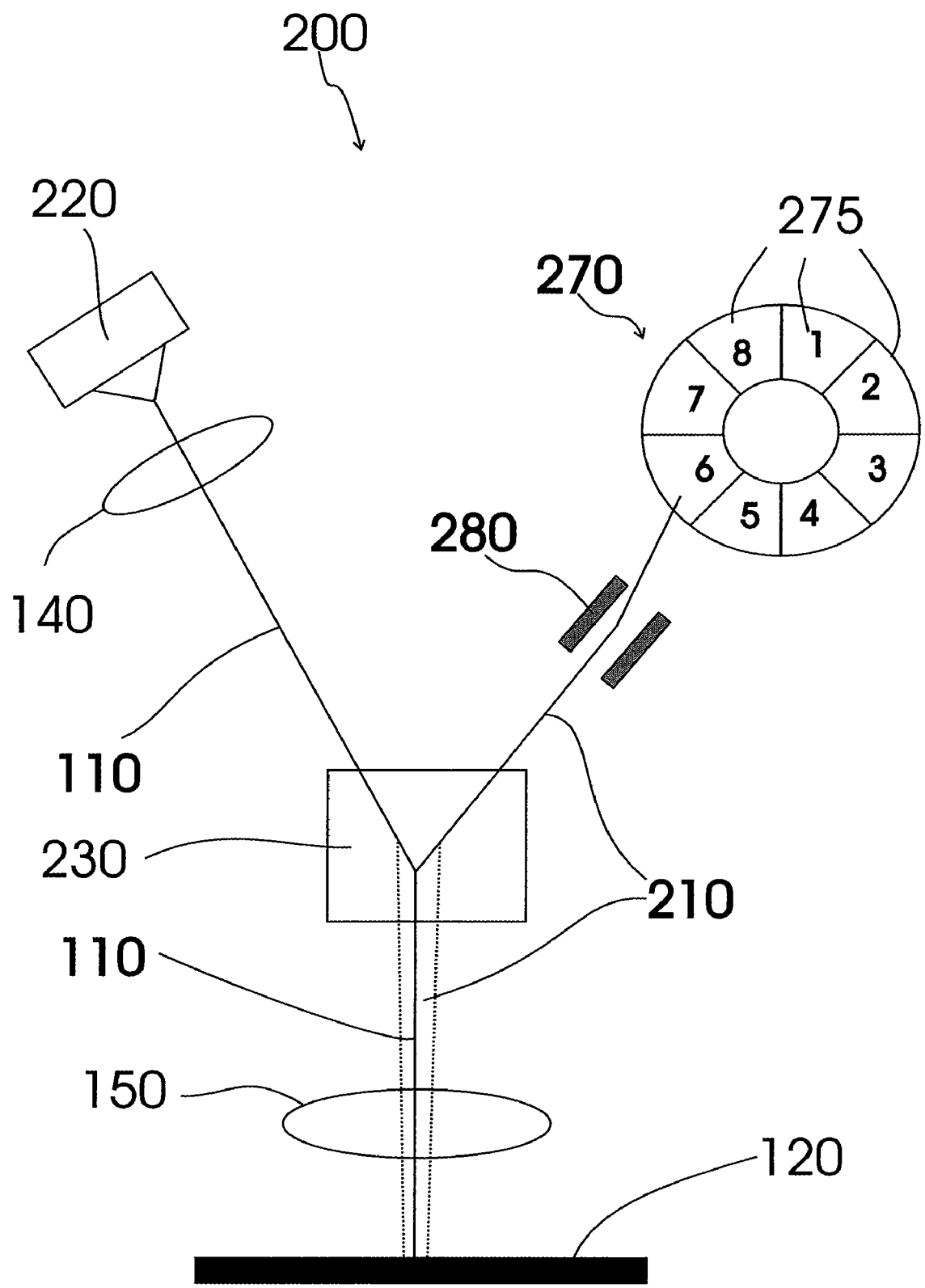
FIG. 2*a* shows a schematic view of a charged particle beam device according to some embodiments described herein.

FIG. 2a shows a schematic view of a charged particle beam device 200. According to embodiments described herein, the charged particle beam device 200 may be an electron beam device as well as an ion beam device or a laser-light system or any other focused beam scanning device. Embodiments of the invention are exemplarily described in the following based on the electron beam device and should therefore not be understood as being limiting.

FIG. 2a shows a charged particle beam having a charged particle source 220 generating the primary charged particle beam 110. The charged particle source may include field emitters, e.g., cold field emitters or thermal field emitters, high brightness Schottky emitters, thermal emitters or field emitter guns or the like. The beam 110 passes the condenser lens 140 and objective lens 150 and is directed to the specimen 120. The specimen 120 is located on a stage (not shown). Typically, the objective lens is a combined electrostatic-magnetic lens.

Further means for directing the primary beam 110 to the specimen may be condenser lenses, alignment and stigmator systems as deflectors, apertures, or any other optical elements. For example, an electric or magnetic fast scanning deflector may be provided in order to scan the primary beam on the specimen. The primary charged particle beam 110 generates a secondary particle beam 210 (indicated by dashed lines) moving in the direction away from the specimen 120.

As the secondary particle beam 210 may have the same beam path as the primary charged particle beam 110, a beam separator 230 may be provided in order to separate the primary beam 110 and the secondary beam 210. Thereby, the primary beam can pass through the separator in the direction of the specimen 120, whereas the secondary particles can move forward in the direction towards the detector 270. Typically, a separator 230 is chosen which is dispersion free, e.g. a magnetic 2B, 3B, or 4B type, a Wien filter, electrostatic-magnetic achromatic deflector or the like. Further, the charged particle beam device may include components for focusing, angular or energetic discrimination of the secondary particle beam.

According to embodiments described herein, the detector 270 is separated in several segments 275. According to embodiments described herein, the segments may be several detection channels. In FIG. 2a, the detector 270 has eight channels. However, the number of the detection channels may vary in a wide range according to the requirements and the type of application. For instance, the number of the detection channels may vary from 2 to 16 or even up to over one hundred or even a few thousand. In most cases and applications, the number of detection channels is typically between 2 and 50, more typically between 4 and 20.

According to embodiments described herein, a distribution deflector 280 is provided deflecting the secondary particle beam 210 to the detector segments 275. Thereby, only one segment is addressed at one time. When the primary charged particle beam moves forward to another point of the sample, another secondary particle beam is generated and directed to another segment of the detector 270. While the segment firstly addressed processes the signal received from the first secondary particle beam, a particle beam corresponding to another position can be generated and another segment not in process can be addressed. In case there are only two detector channels, in the next step and when the primary particle beam was moved to yet another point of the specimen, the first detector channel can again be addressed since it has finished in the meantime processing the initially received signal.

The segments or detection channels of the detector may be provided by different embodiments. The detector is built up by a scintillation element and a photo sensor element. The terms "segments" and "detection channels" in this context are used synonymously and refer to the embodiments described below.

According to some embodiments, the separation of the detector takes place in the scintillator having at least two segments. The scintillator absorbs the energy of the secondary particles and releases the absorbed energy by releasing a photon. When two successive secondary particles reach a detector in a short time period, which is below the time resolution of the detector, it is impossible to separate the signals of the two different secondary particles and the information of the secondary particles cannot be correctly imaged. Without practicing embodiments of the invention, the primary particle beam has to wait until a certain time interval depending on the resolution of the scintillator and the photomultiplier is over before scanning the next point of the sample. In the detection assembly according to embodiments described herein, it is not necessary to wait, but the primary beam can scan the next point of the sample and the deflection unit directs the secondary particle beam to a detector channel that is available for processing the signal.

According to embodiments described herein, the scintillator may be directly connected to a plurality of optical fibers. The plurality of optical fibers can provide segmentation as one optical fiber can pass only the photons received in one segment. Thereby, several detection channels are provided.

According to embodiments described herein, the segmentation of the deflector may be given by a thin scintillator element with a following photomultiplier as photo sensor element. The term "thin" in this context refers to a thickness of the scintillator that may be dependent on the diameter of the scintillator, i.e. the thickness is smaller than the width of the scintillator. For instance, a scintillator having a diameter of 10 to 20 mm and 8 segments, typically may have a thickness that may be less than 2.5 mm. Typically, the thickness may be from 0.1 to 1 mm, more typically from 0.2 to 0.7 mm, and even more typically from 0.3 to 0.5 mm. Thereby, according to some embodiments, which can be combined with any of the embodiments described herein, the thickness of the scintillator can be smaller as the mean width, typically as half of the mean width, of a portion of the scintillator corresponding to a segment, i.e., the portion corresponding to a detection channel.

By providing a low thickness of the scintillator element, it is possible to detect the absorbed energy at the point where it hit the scintillator. The scintillator being hit by a charged particle generates a photon to compensate the received energy and to start again in the original state. In a detection unit, the photon must travel through the scintillator element to go to the photo sensor element. Thereby, the photon does not move straight and may bear away so that it leaves the scintillator at another place as it would do in case of a straight movement. Providing a thin scintillator element helps minimizing the deviation of a straight movement of the photon. The adjacent photo sensor element may be segmented and receives the photon in the place, where it exits the scintillator, which is approximately the place where the charged particle entered the scintillator. Therefore, a signal can be generated which includes information of the original landing of the secondary particle beam on the thin scintillator plate due to deflection. However, a spatial segmentation of the scintillator may be omitted in this embodiment.

Typically, in this embodiment, eight photomultipliers may be provided for one thin scintillator in order to achieve eight channels.

According to embodiments that can be combined with other embodiments described herein, a photo sensor element as referred to above may be typically a semiconductor detector such as a diode, a photomultiplier, a PIN diode, a channel plate or the like.

The distributing deflector 280 directs the secondary particle beams consecutively to the different segments or detection channels. Therefore, the signal for the distributing deflector 280 is synchronized with a pixel clock and/or with the scanning signal.

Figure 2B:
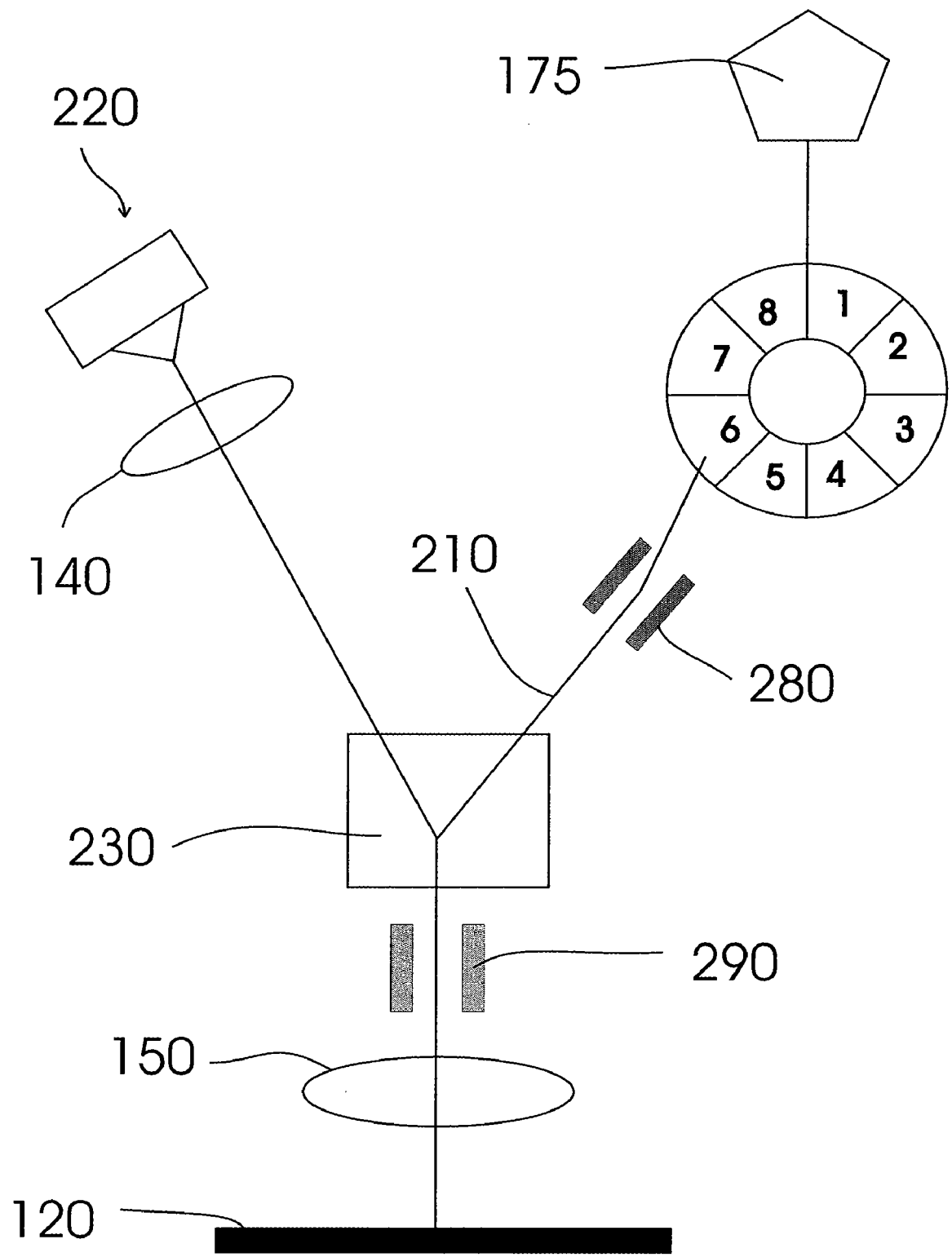
FIG. 2*b* shows a schematic view of another charged particle beam device according to some embodiments described herein.

FIG. 2b shows a further embodiment. The difference between FIG. 2a and FIG. 2b is the compensation deflector 290. The compensation deflector compensates the secondary electron beam movement due to the scanning over the specimen 120. Further, the distributing deflector 280 is provided for directing the secondary particle beam 210 on the particular detection channel 1 to 8. According to some embodiments, the compensation deflector may also be integrated into the distributing deflector 280. Further, the charged particle beam device may have a data acquisition system 175 for collecting the data from the detector, detector segments or detector channels and creates the image according to the received data.

Figure 2C:
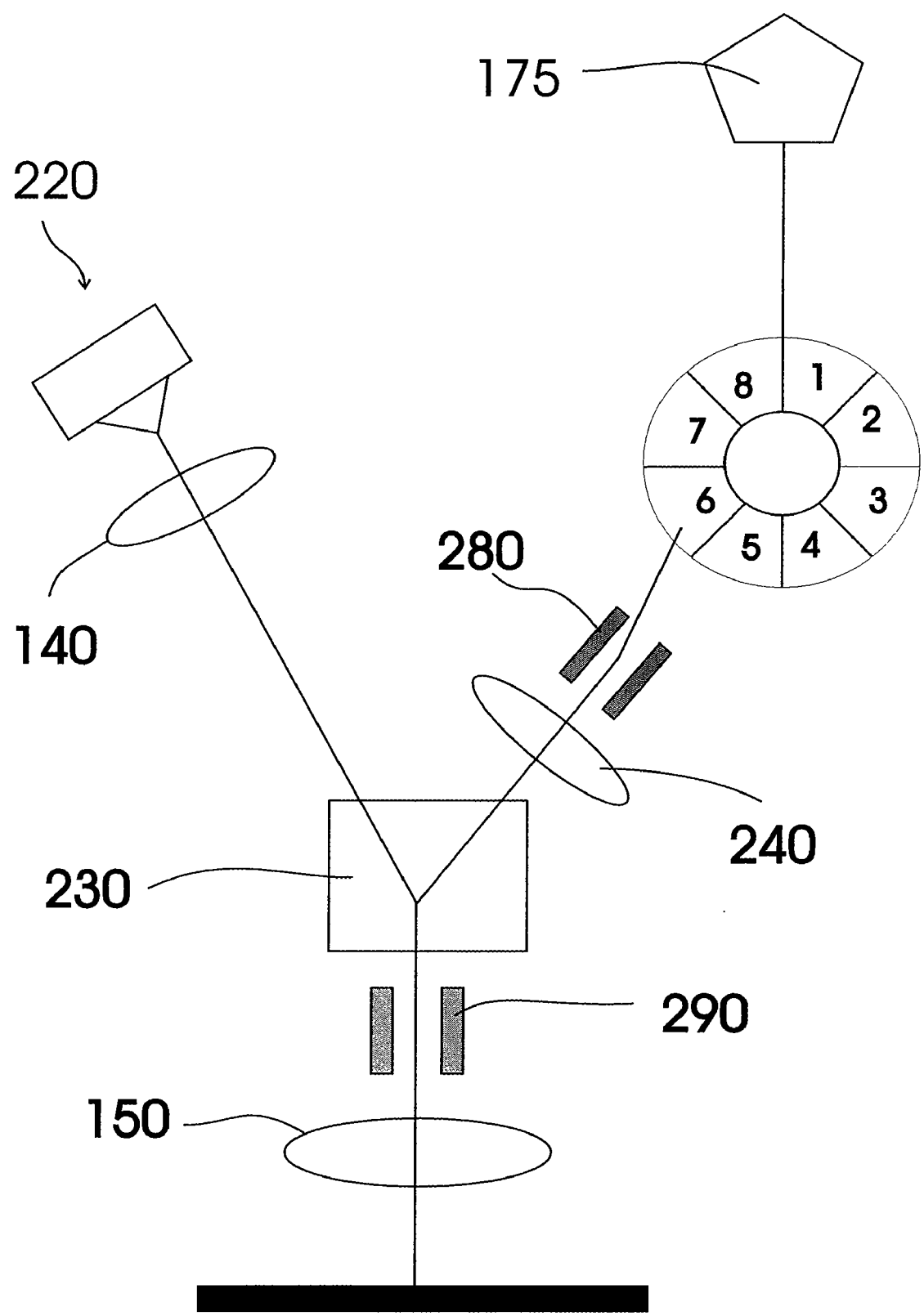
FIG. 2*c* shows a schematic view of yet another charged particle beam device according to some embodiments described herein.

FIG. 2c shows an embodiment according to the invention, further providing an additional lens 240 for concentrating the secondary particle beam before being deflected to the detector segments or detector channels.

Typically, the charged particle beam device according to embodiments described herein may also include a system for correcting dynamically off-axis aberration such as field curvature, astigmatism, distortion, transverse chromatic, landing angle and the like. The optical systems described above may but do not have to include all of the listed components. Any combinations of the components are in the scope of the invention.

Figure 3A:
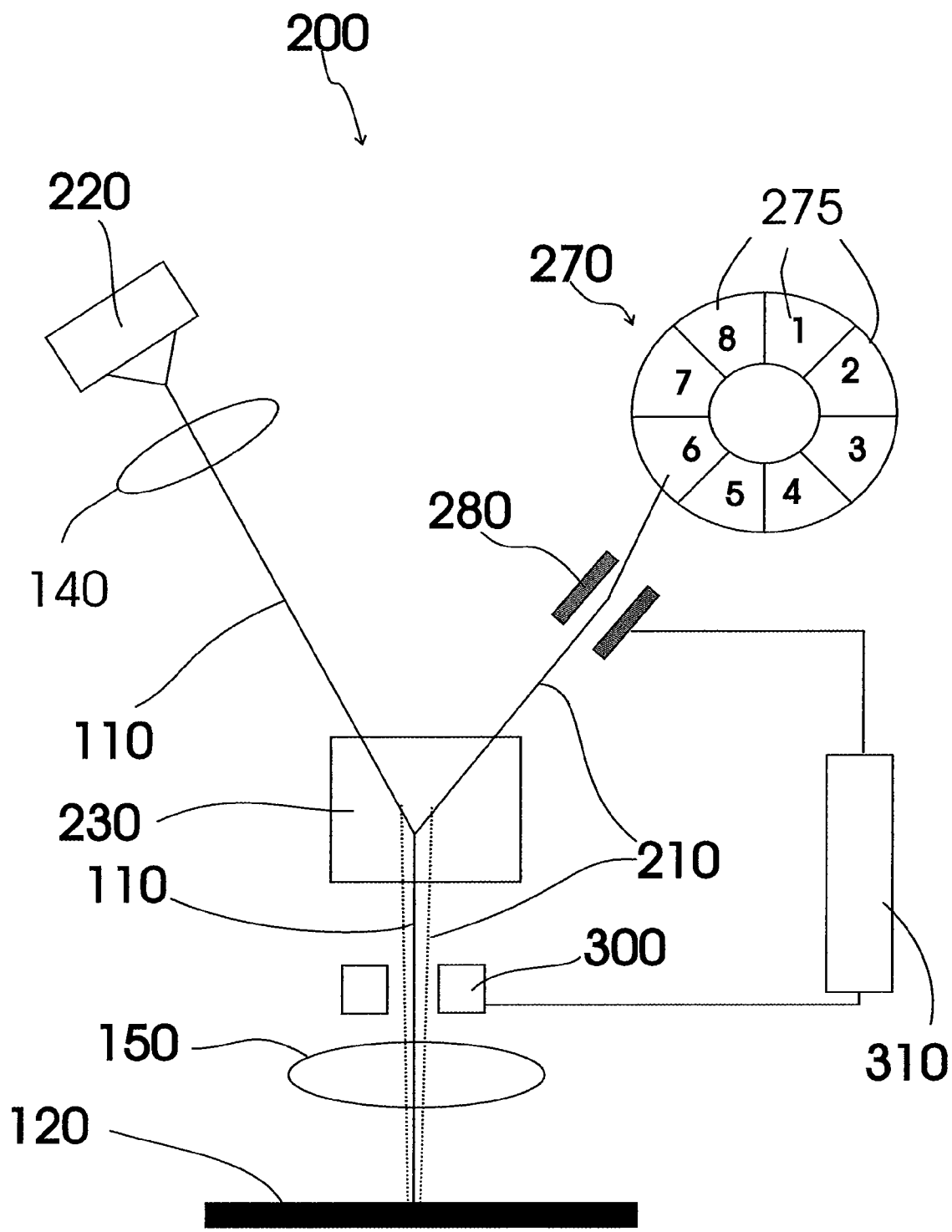
FIG. 3*a* shows a schematic view of a control arrangement in a charged particle beam device according to embodiments described herein.

According to some embodiments described herein, a controller 310 is provided. FIG. 3a shows an embodiment of a control arrangement. The controller can control and supervise several parameters such as deflection parameters. In FIG. 3a, a controller 310 is connected to a scan deflecting device 300 and the distribution deflector 280. Thereby, the scanning deflector 300 helps scanning the primary particle beam 110 over the specimen 120. The scanning deflector 300 "leads" the beam 110 over the specimen and allows directing the beam to the pixels of the sample one by one. As can be seen in FIG. 3a, the control unit is also connected to the distribution deflector 280. The controller 310 in this arrangement is able to coordinate the scanning of the scan deflector 300 and the operation of the distribution deflector 280. For instance, when the scan deflector deflects the primary beam 110 to the next pixel on the sample, this information is given to the distribution deflection device 280 by the control unit 310. The distribution deflector 280 may then, according to the information received, deflect the incoming secondary particle beam 210 to a certain segment of the detector 270.

According to embodiments described herein, the scan deflector 300 may also receive information about the deflection of the distribution deflector 280 by the control unit 310. In this case, the received information allows directing the primary particle beam 110 to the next pixel to be scanned after the distribution deflector 280 has directed the secondary particle beam to one segment of the detector 270.

Figure 3B:
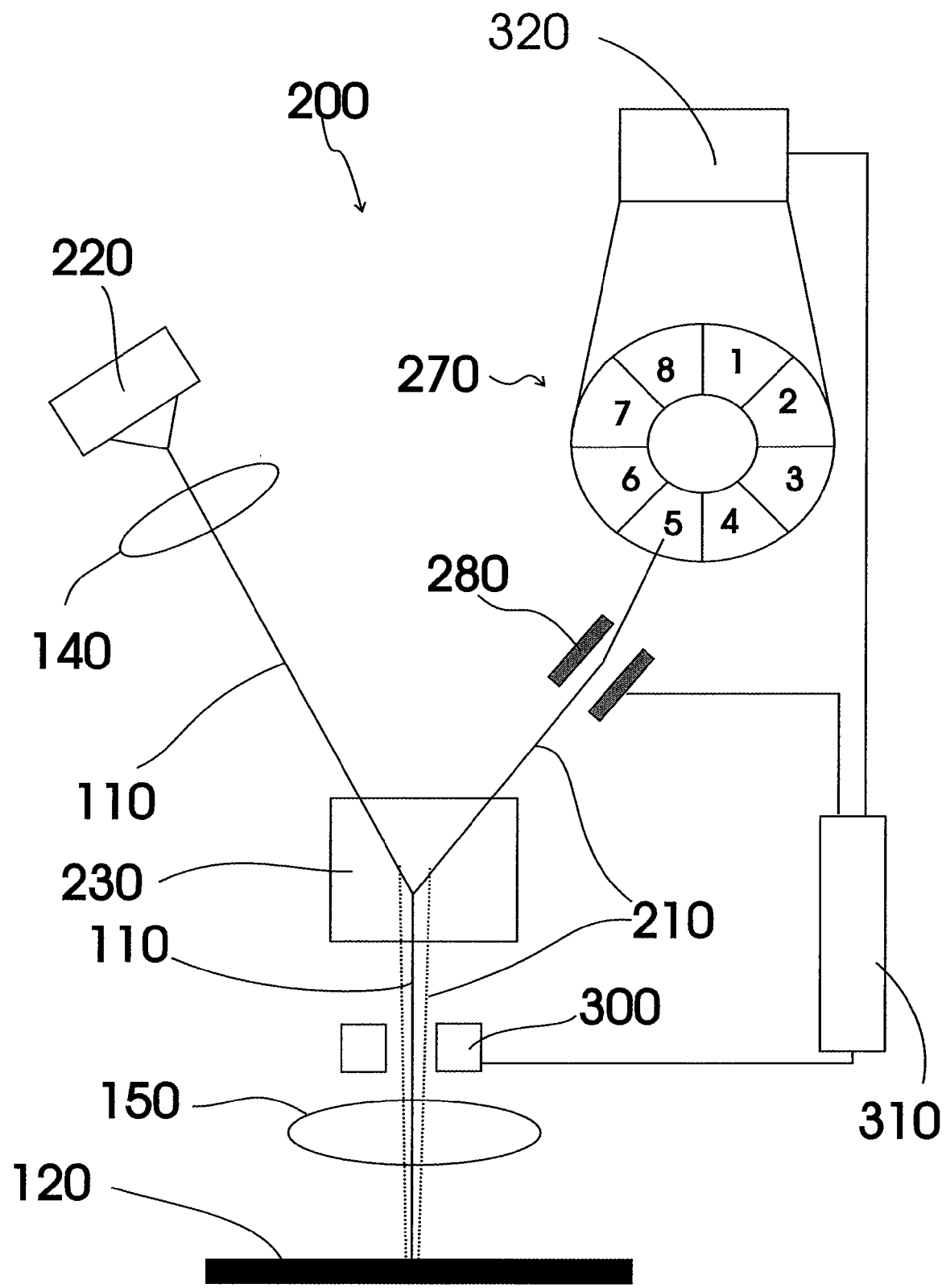
FIG. 3*b* shows a schematic view of a further control arrangement in a charged particle beam device according to embodiments described herein.

FIG. 3b shows a further control arrangement in a charged particle beam device. According to some embodiments described herein, the detector 270 is connected to an evaluation unit 320. This evaluation unit 320 may also be connected to the controller 310. The evaluation unit 320 receives signals from the detector 270. The signals may include information about the segment actually used, i.e. on which segment the secondary particle beam 210 is directed by the distribution deflector 280. The information of the segments can be passed to the distribution deflector 280 as well as to the scan deflecting device 300 or to both by the controller 310. Typically, the controller 310 can calculate the segment of the detector 270, which should be used next and pass this information to the deflectors 280 and/or 300. Thereby, the scan deflector can direct the primary particle beam 110 to the next pixel and the distribution deflector can direct the secondary particle beam 210 to a certain segment.

According to some embodiments, the above described control unit, the scan deflector and/or the evaluation unit can be combined with any embodiments described herein, for instance with the charged particle beam devices shown in FIGS. 2a, 2b, and 2c.

Figure 4A:
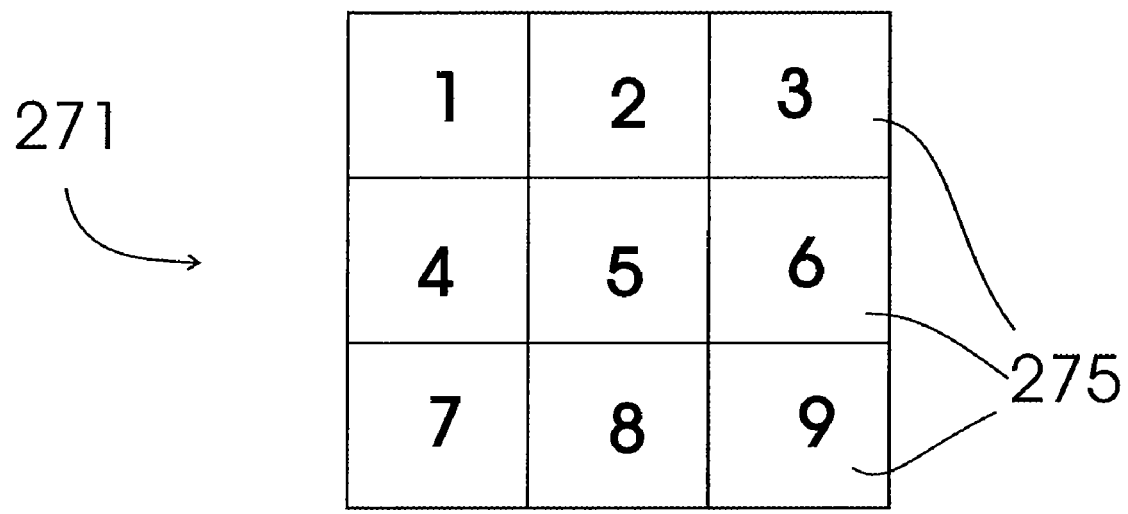
FIG. 4*a* shows a schematic view of the detector channels according to embodiments described herein.
Figure 4B:
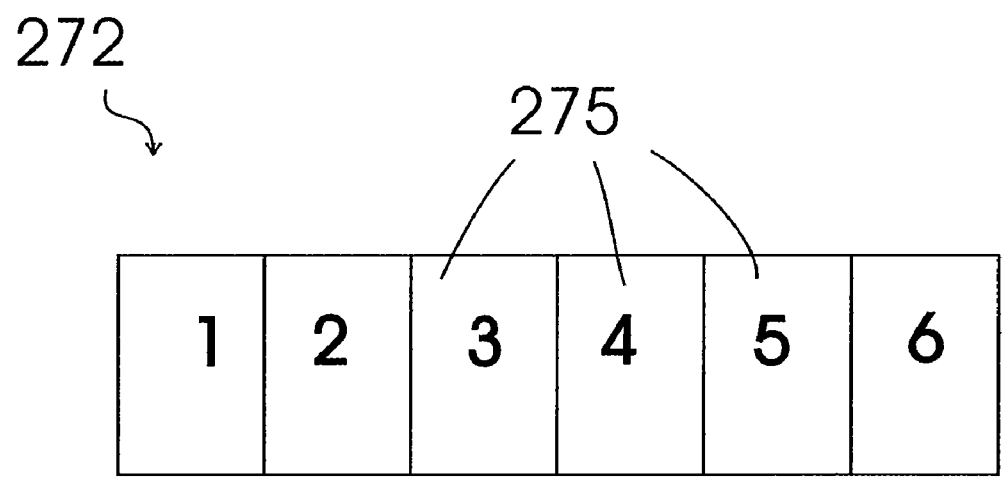
FIG. 4*b* shows a schematic view of another arrangement of detector channels according to embodiments described herein.

In FIGS. 4a and 4b, embodiments are shown which can be combined with any other embodiments described herein. Multi-channel detectors 270, 271, and 272 can be any type of multi-channels, e.g. scintillator based, PIN diode based, quantum well/quantum dot based and the like. Typically, the detector channels are arranged in a circle, which is advantageous with regard to the deflection of the secondary particle beam as a high bandwidth of the distributing deflector is a challenging aspect of the invention. Having detector channels arranged in a circle, the distributing deflector signal has a pure sine/cosine form. Nevertheless, according to embodiments described herein, the multi-channel detector may also be arranged in any other manner, for example in a square shape as shown in FIG. 4a or in a line as shown in FIG. 4b. The number of the detection channels in FIGS. 4a and 4b are exemplarily and are not limiting to the scope of the invention.

Figure 5:
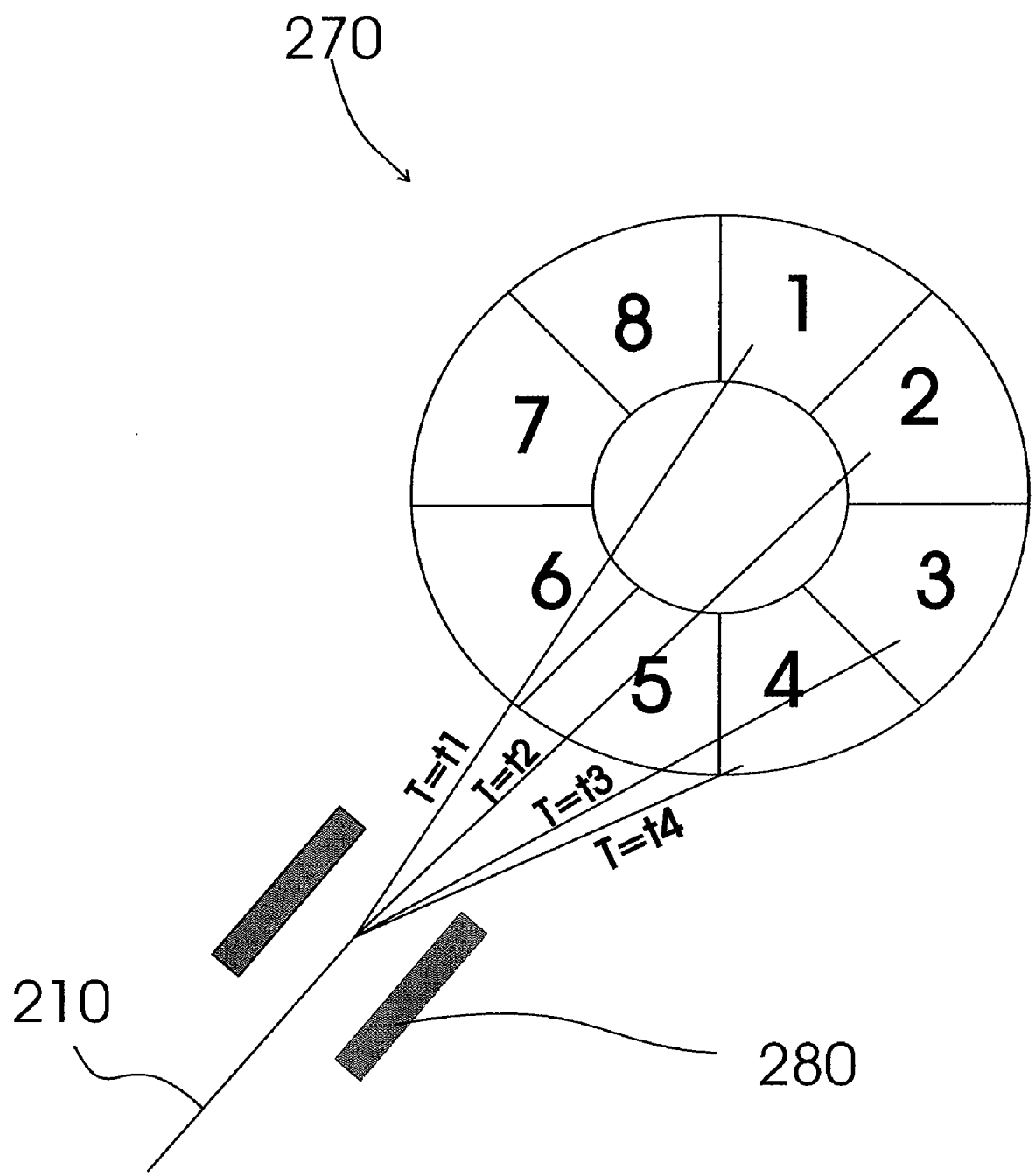
FIG. 5 shows a schematic view of a detection assembly according to embodiments described herein.

FIG. 5 shows a schematic view of a detection assembly according to embodiments described herein. In FIG. 5, four points in time t1, t2, t3, and t4 are demonstrated. The secondary particle beam 210 passes to the distributing deflector 280 and is distributed to different detector channels. Hence, the four lines for t1, t2, t3, and t4 should be understood as being sequentially directed to the detector segments. When the first secondary electron beam passes the deflector 280 at time T=t1, the beam is directed to segment 1. While segment 1 processes the received signal, the primary electron beam continues scanning the sample and a second secondary particle beam is generated at time T=t2. Thereby, it is typically that the difference t2-t1 is smaller than the time necessary for processing the signal of element 1. The second secondary beam is directed to segment 2. Again, while segment 2 is still in progress for processing the received signal, the primary beam continues scanning and generates a third secondary particle beam at time T=t3. The third secondary beam is directed to the detector channel 3. Again, the difference t3-t2 is smaller than the time necessary for processing the signal of element 2. Typically, the difference t3-t1 is smaller than the time necessary for processing the signal of element 1. The process goes on until at time T=t8 segment 8 receives a signal. Typically, the difference t8-t1 is equal to the time necessary for processing the signal of element 1. Therefore, as soon as element 1 is again ready for receiving a signal, a signal can be directed to this element and the maximum of time saving can be achieved.

The term "sequentially" may refer in this context to a sequence, which can be described as using one detector segment per pixel on the specimen. More specifically, it means that the secondary particle beam formed by the interaction of the primary particle beam and one pixel of the specimen (location corresponding to a pixel) is directed to one detector segment and the secondary particle beam formed by the interaction of the primary particle beam with the next pixel is directed to the next detector segment.

Figure 6:
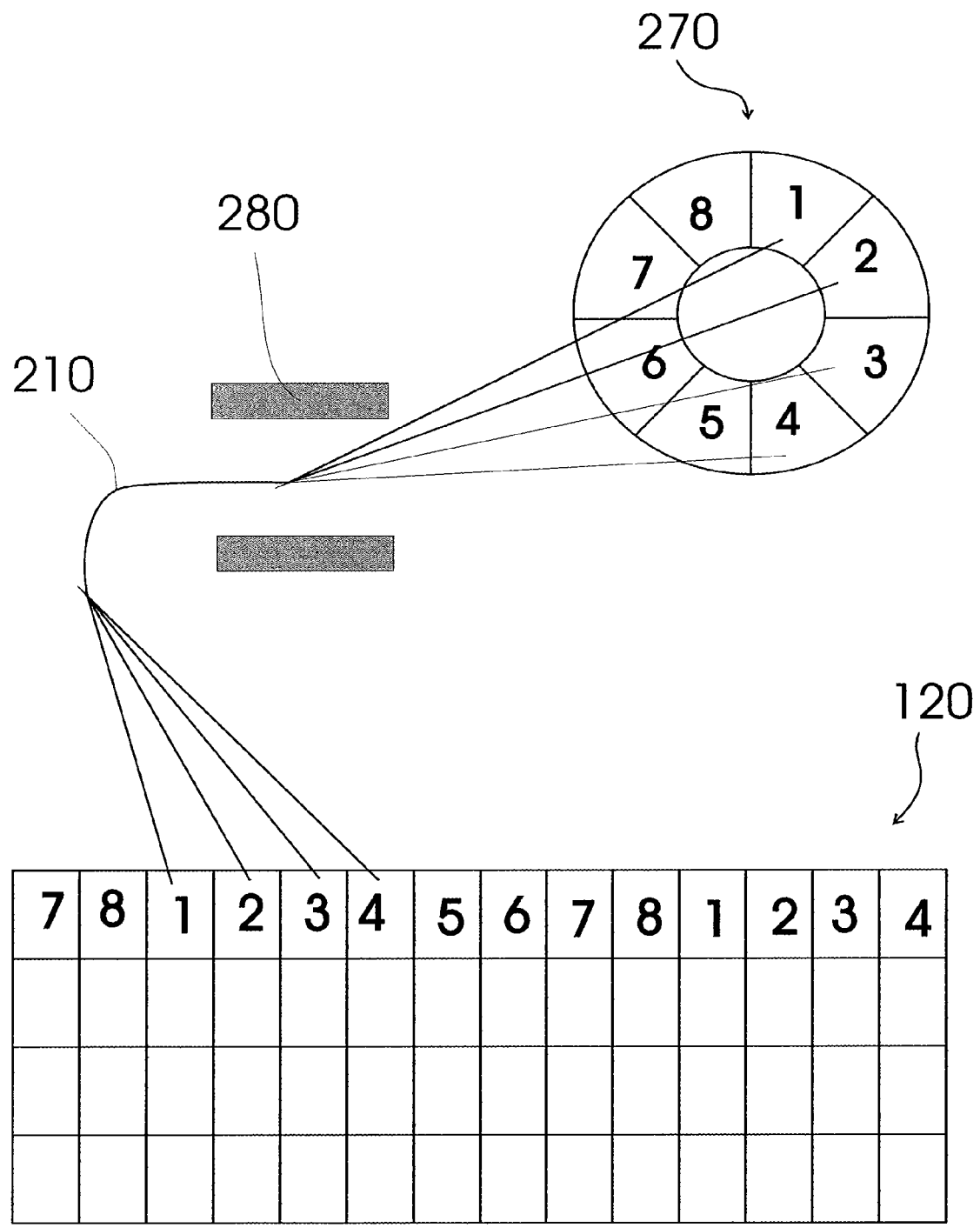
FIG. 6 shows a schematic view of time dependent scanning of a sample with the detection assembly according to embodiments described herein.

FIG. 6 shows a detailed view of the scanning process. The sample 120 is virtually divided in several pixels, which means, in several parts or portions to be inspected. In FIG. 6, the pixels are numbered according to the number of detector channels. Nevertheless, a numeration of the pixels is not necessary and serves just for visualization. As described in the context of FIG. 5, one pixel is scanned at a time. For example, pixel 1 is scanned at time T=t1 and the resulting secondary particle beam is directed to element 1. Pixel 2 is scanned at time T=t2 and the resulting secondary particle beam is directed to element 2 and so forth. Each detection channel is responsible only for a certain portion of the total pixel amount (for instance, in FIG. 6, detection channel 1 is responsible for all pixels numbered 1) and thus the required bandwidth of each detection channel is only a portion of the total pixel rate.

According to embodiments described herein, the signal in the distributing deflector 280 is synchronized with a pixel clock and the scanning signal. Therefore, it is possible to adjust the deflection of the secondary particle beam 210 to the scanned pixel and to the respective detector channel.

According to embodiments described herein, the detection assembly of FIGS. 5 and 6 can, for instance, be applied to the charged particle device of FIG. 1. The charged particle device of FIG. 1 is a single beam device. According to embodiments described herein, the detector assembly of FIG. 5 or 6 may also be used in a multi-beam or a multi-column system by applying the multi channel detector (as for instance shown in FIGS. 4a and 4b) for each beam of the system.

According to some embodiments, which can be combined with other embodiments described herein, a description of typical parameters of the application is given in the following. The response time of a fast scintillator type detector can be about 3 ns for a pixel. The response time of a semiconductor detector, for instance a PIN diode, can be about 2 ns and therefore not significantly shorter than the response time of the fast scintillator type detector. This may limit the speed of the single beam inspection system to 0.3 to 0.5 GPixel/second. However, the pixel acquisition time can be desired to be about one order of magnitude higher. With an inspection system having a charged particle beam device as described, it is possible to provide a pixel acquisition time that is significantly increased. Thereby, a beam current of 20 nA and a detector with 10 detector channels can be used. With 40000 pixels per line and a line frequency of 83 kHz a pixel time of 0.3 ns can be achieved, when the distributing deflector frequency is 330 MHz.

According to embodiments described herein, a method of operating a particle beam device with chronological resolution is provided. The particle beam device includes usual optical components for alignment, calibration, measurement, maintenance, and service. These components are not described in further detail because a person skilled in the art will know the functionality and therefore the necessary components of a charged particle beam device.

Typically, a primary charged particle beam emitted from an emitter is directed to a specimen to be inspected. The specimen may include semiconductor wafers, masks, biological specimen, and the like. The primary beam impinges on the specimen. As the charged particles may be electrons, ions, photons or any other kind of charged particles, the primary beam causes a reaction on the sample. This reaction may be a simple backscattering of the particles of the primary beam or as well releasing of particles of the sample. These backscattered or released particles are known as secondary particles forming a secondary particle beam.

The secondary particle beam moves in a direction away from the specimen. According to embodiments described herein, the secondary particle beam is directed to a detector having at least two detector channels or segments. The directing of the secondary particle beam may be achieved by the use of a deflector or the like. The secondary particle beam is time dependent distributed to the respective detector channel. Thereby, one detector channel detects the signal of one pixel of the sample at one point of time. By deflecting the beam sequentially to the detector segments, a faster scanning of the primary beam over the specimen becomes possible.

Figure 7:
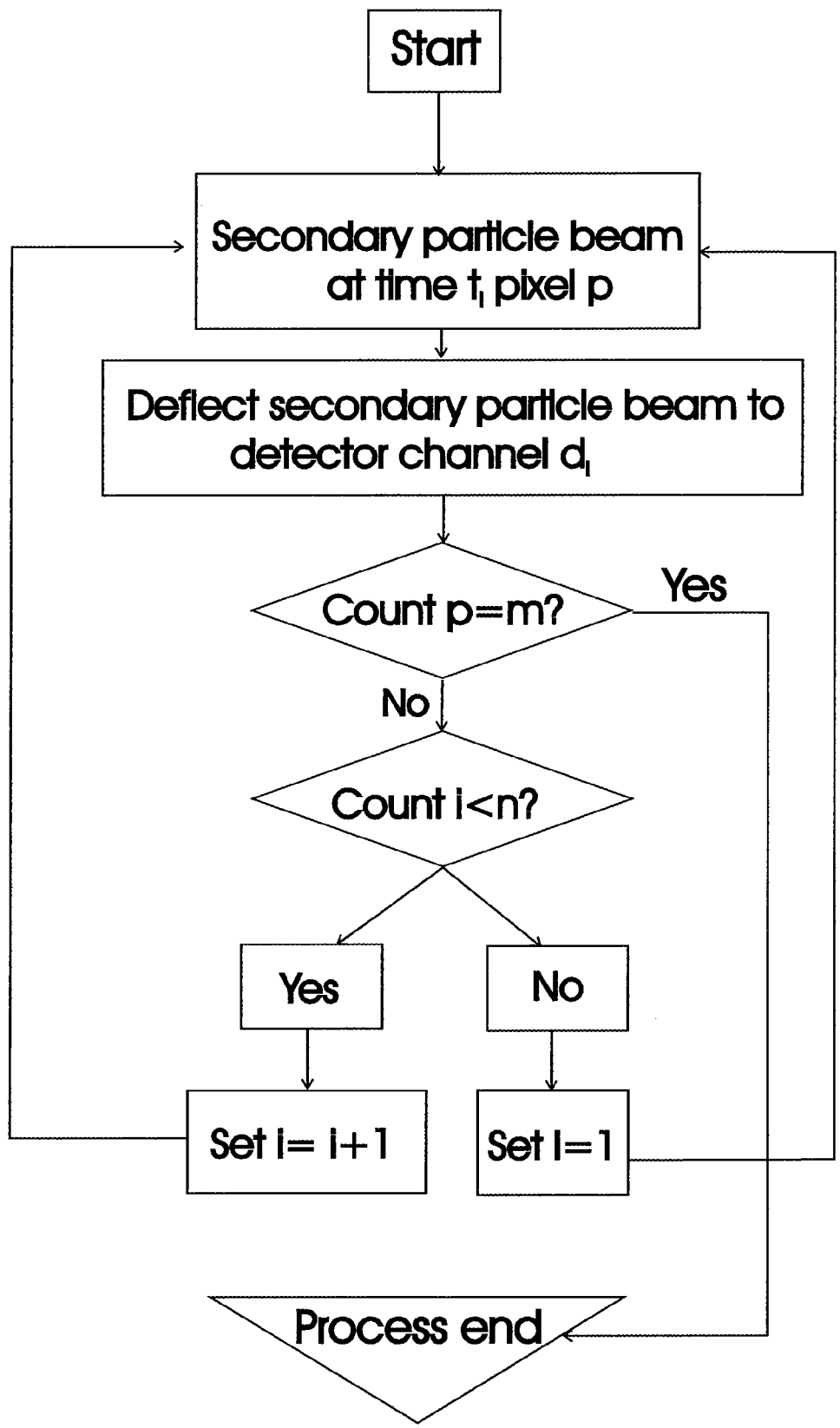
FIG. 7 is a schematic flow diagram of the time dependent operation of the detector assembly.

FIG. 7 shows a schematic flow diagram of the method according to embodiments described herein. The variable "m" indicates the total amount of pixels of the sample, whereas the variable "n" is the number of detector channels. The process starts with the impingement of the primary particle beam on the sample. A secondary particle beam is generated at time $t_i$ by the impingement of the primary particle beam on pixel p. The secondary particle beam is directed to a detector channel $d_i$. In the next step, the number of the pixel is compared to the total amount of pixels on the sample. If the number p of the pixel is equal to the total number m of pixels on the sample, the process is concluded.

If the number p of pixels is less than the total number m of pixels, the process continues by comparing the control variable i to the number n of detector channels. If i is less than n, that means, if the control variable is smaller than the number of detector channels, i is increased by one. By increasing i by one, the next pixel is scanned and its signal is deflected to the next detection channel. If i is equal to n, that means, if the control variable has reached the number of detection channels, i is set to 1 and in the next processing step, the next pixel is scanned and its signal is deflected to detector channel 1.

Typically, an analyzer or a calculation unit calculates and compares the variables in order to indicate the corresponding signals, for instance a signal to the deflector, to which detector channel the actual secondary beam should be directed.

The charged particle beam device and the detector assembly described above are parts of a fast wafer inspection system, including components like electronics for acquisition of the data from the detectors and creation of the image, electronics and software for controlling the function of the individual components, wafer chamber, vacuum system of the column and of the wafer chamber if necessary, wafer stage, wafer loading system, data analysis system e.g. for comparison of the acquired data with database information and for defect identification.

The description above gives an overview of the main and principal components of the fast wafer inspection system. It is not possible to describe all details and technical solutions of the individual components. The figures should not be understood as complete exposure of the possible configuration alternatives but as an example for illustration of the principles of the invention.

While the foregoing is directed to embodiments of the invention, other and further embodiments of the invention may be devised without departing from the basic scope thereof, and the scope thereof is determined by the claims that follow.

The invention claimed is:

1. Detection assembly for fast wafer inspection for inspecting a sample with a primary charged particle beam, which is adapted to be directed to pixels of the sample one by one at a pixel rate, for generating a secondary particle beam by impinging of the primary beam on the sample, the detector assembly further comprising
    a detector unit for detecting the secondary particle beam, the detector unit having a scintillator and at least two detector channels, wherein each detector channel comprises a photomultiplier and
    a distribution deflecting device for distributing the secondary particle beam on the at least two detector channels in a chronological sequence
wherein a bandwidth of each of the at least two detector channels is only a portion of the pixel rate.

2. Detection assembly according to claim 1, wherein the detection assembly is adapted for sequentially directing the secondary particle beam to the different detector channels of the at least two detector channels of the detector unit pixel per pixel.

3. Detection assembly according to claim 1, wherein the deflecting device deflects the secondary particle beam according to a predetermined pattern.

4. Detection assembly according to claim 1, wherein the number of the detector channels is between 2 and 20.

5. Detection assembly according to claim 1, wherein the detector channels are arranged in a circle.

6. Detection assembly according to claim 1, further comprising a calculation unit for calculating the respective signal of the deflector.

7. Detection assembly according to claim 1, wherein each detection channel is responsible for a portion of the total pixel amount of the sample.

8. Detection assembly according to claim 1, further comprising means for focusing the secondary particles.

9. A charged particle beam device, comprising:
   a detection assembly according to any of the preceding claims.

10. Charged particle beam device according to claim 9, further comprising:
    a scan deflecting device for the primary particle beam and a control unit.

11. Charged particle beam device according to claim 9, further comprising
    a particle source for emitting a primary particle beam, adapted for generating a secondary particle beam on impingement of the primary particle beam on a sample.

12. Charged particle beam device according to claim 9, further comprising a separator for separating the primary and the secondary particle beam.

13. Charged particle beam device according to claim 9, further comprising a pixel clock for synchronizing the distribution of the secondary particle beam.

14. Charged particle beam device according to claim 13, wherein the pixel clock is connected to the calculation unit.

15. A method of operating a particle beam device with chronological resolution comprising
    directing the primary particle beam to pixels of a sample one by one at a pixel rate for scanning the sample thereby generating a secondary particle beam coming from the sample,
    directing the secondary particle beam towards a detector unit having a scintillator and at least two detection channels, wherein each detector channel comprises a photomultiplier, and wherein a bandwidth of each of the at least two detector channels is only a portion of the pixel rate, and
    distributing the secondary particle beam in a chronological sequence to the at least two detector channels.

16. Method according to claim 15, further comprising synchronising the distribution of the secondary particle beam by means of a pixel clock.

17. Method according to claim 15, further comprising increasing a detection speed of the detector unit by a factor equal to the number of detection channels.

18. Method according to claim 15, wherein each channel of the at least two channels of the detector unit detects only a time-dependent portion of the total amount of the secondary particles.

19. Method according to claim 15, wherein the detection bandwidth corresponds to the detection channel bandwidth multiplied with the number of detection channels.

20. Method according to claim 15, wherein the primary particle beam is directed to the pixels of the sample by a scan deflecting device which receives signals from a control unit.

21. Method according to claim 20, wherein the secondary particle beam is distributed by a distributing deflector which receives signals from the control unit, and wherein the signal for the distributing deflector and the signal for the scan deflecting device are synchronized.

22. Method according to claim 15, wherein the primary particle beam continues scanning the sample while at least one detection channel is detecting secondary particles.

* * * * *